(12) United States Patent
Kim et al.

(10) Patent No.: US 10,360,834 B2
(45) Date of Patent: Jul. 23, 2019

(54) DISPLAY SUBSTRATE HAVING GATE DRIVING CIRCUIT

(71) Applicant: Samsung Display Co., Ltd., Yongin-si, Gyeonggi-do (KR)

(72) Inventors: Wonho Kim, Seongnam-si (KR); Sungman Kim, Seoul (KR); Hyeonhwan Kim, Asan-si (KR); Seongsu Lim, Seoul (KR); Sangjin Jeon, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 234 days.

(21) Appl. No.: 15/602,692

(22) Filed: May 23, 2017

(65) Prior Publication Data

US 2017/0343865 A1 Nov. 30, 2017

(30) Foreign Application Priority Data

May 24, 2016 (KR) .......................... 10-2016-0063663

(51) Int. Cl.
| G11C 19/00 | (2006.01) |
| G09G 3/20 | (2006.01) |
| G09G 3/36 | (2006.01) |
| G02F 1/1345 | (2006.01) |

(52) U.S. Cl.
CPC ....... *G09G 3/2007* (2013.01); *G02F 1/13454* (2013.01); *G09G 3/3677* (2013.01); *G09G 3/3688* (2013.01); *G09G 2300/0426* (2013.01); *G09G 2310/08* (2013.01); *G09G 2380/02* (2013.01)

(58) Field of Classification Search
None
See application file for complete search history.

(56) References Cited

U.S. PATENT DOCUMENTS

| 2005/0263762 A1* | 12/2005 | Kim ................... G02F 1/13454 257/66 |
| 2007/0063233 A1* | 3/2007 | Joo ................... G02F 1/134336 257/291 |
| 2017/0242305 A1* | 8/2017 | Liao ..................... G09G 3/3677 |

FOREIGN PATENT DOCUMENTS

| KR | 10-1335551 | 12/2013 |
| KR | 10-2015-0071782 | 6/2015 |
| KR | 10-1573460 | 12/2015 |

* cited by examiner

*Primary Examiner* — Tuan T Lam
(74) *Attorney, Agent, or Firm* — Lewis Roca Rothgerber Christie LLP

(57) ABSTRACT

A display substrate includes a first substrate having a display area and a non-display area, a plurality of pixels at the display area, and a gate driving circuit at the non-display area and including an output transistor including a channel region, an insulation layer covering the output transistor, and a capacitor on the insulation layer, electrically connected to the output transistor, and including a first capacitor electrode on the insulation layer, overlapping the channel region of the output transistor, and electrically connected to a first electrode of the output transistor, a first protection layer covering the first capacitor electrode, and a second capacitor electrode on the first protection layer, overlapping the channel region of the output transistor, and electrically connected to a gate electrode of the output transistor.

14 Claims, 9 Drawing Sheets

DISPLAY SUBSTRATE HAVING GATE DRIVING CIRCUIT

CROSS-REFERENCE TO RELATED APPLICATION

This patent application claims priority to, and the benefit of, Korean Patent Application No. 10-2016-0063663, filed on May 24, 2016, the entire contents of which are hereby incorporated by reference.

BACKGROUND

The present disclosure relates to a display substrate including a gate driving circuit.

A display device includes a plurality of gate lines, a plurality of data lines, and a plurality of pixels connected to the plurality of data lines. The display device includes a gate driving circuit configured to provide gate signals to the plurality of gate lines, and a data driving circuit configured to output data signals to the plurality of data lines.

The gate driving circuit includes a shift resistor including a plurality of driving stage circuits (hereinafter referred to as driving stages). The plurality of driving stages output gate signals corresponding to the plurality of gate lines, respectively. Each of the plurality of driving stages includes a plurality of transistors that are connected to each other. The gate driving circuit may be mounted in a non-display area of a display substrate through a thin film process, and may be simultaneously formed with pixels.

SUMMARY

The present disclosure provides a display substrate including a gate driving circuit having reduced circuit area.

An embodiment of the present disclosure provides a display substrate including a first substrate having a display area and a non-display area, a plurality of pixels at the display area, and a gate driving circuit at the non-display area and including an output transistor including a channel region, an insulation layer covering the output transistor, and a capacitor on the insulation layer, electrically connected to the output transistor, and including a first capacitor electrode on the insulation layer, overlapping the channel region of the output transistor, and electrically connected to a first electrode of the output transistor, a first protection layer covering the first capacitor electrode, and a second capacitor electrode on the first protection layer, overlapping the channel region of the output transistor, and electrically connected to a gate electrode of the output transistor.

The output transistor may include a gate insulation layer on the gate electrode, the gate electrode being on a first insulation substrate, a semiconductor layer on the gate insulation layer, and with the first electrode thereon, a second electrode on the semiconductor layer and spaced from the first electrode, and a second protection layer on the first electrode and the second electrode, and the channel region may correspond to a separation area between the first and second electrodes.

The insulation layer may be on the second protection layer.

The second capacitor electrode may contact the gate electrode through a first contact hole defined in the first protection layer, the insulation layer, the second protection layer, and the gate insulation layer.

The capacitor may further include a connection electrode spaced from the second capacitor electrode on the first protection layer, contacting the first electrode through a second contact hole defined in the first protection layer, the insulation layer, and the second protection layer, and contacting the first capacitor electrode through a third contact hole defined in the first protection layer.

The second electrode may be connected to a clock signal, the gate electrode may be connected to a first node for receiving a previous carry signal, and the first electrode may be connected to an output terminal for outputting a k-th gate signal.

Each of the first capacitor electrode and the second capacitor electrode may overlap the second electrode.

Each of the first capacitor electrode and the second capacitor electrode may overlap the gate electrode.

Each of the first capacitor electrode and the second capacitor electrode may overlap the first electrode.

The display substrate may further include a second substrate facing the first substrate, and a liquid crystal layer between the first substrate and the second substrate.

Each of the pixels may include a common electrode on the insulation layer, and a pixel electrode on the first protection layer, and the first protection layer may cover the common electrode.

The common electrode and the first capacitor electrode may be in a same layer on the insulation layer.

The pixel electrode and the second capacitor electrode may be in a same layer on the first protection layer.

The insulation layer may include an organic insulation layer.

BRIEF DESCRIPTION OF THE DRAWINGS

The accompanying drawings are included to provide a further understanding of the inventive concept, and are incorporated in, and constitute a part of, this specification. The drawings illustrate exemplary embodiments of the inventive concept and, together with the description, serve to explain aspects of the inventive concept. In the drawings.

DETAILED DESCRIPTION

Figure 1:
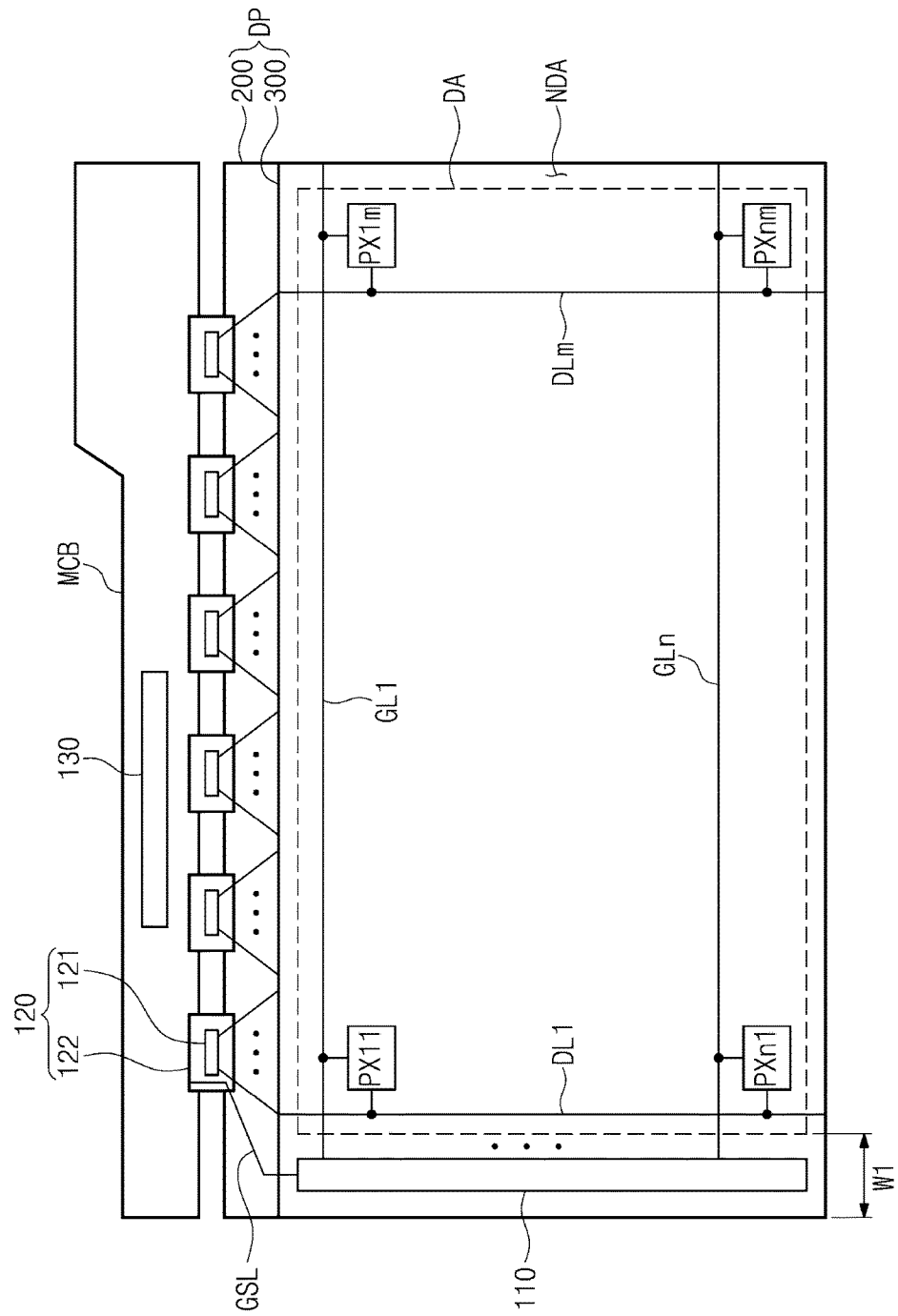
FIG. 1 is a plan view of a display substrate according to an embodiment of the inventive concept.

Features of the inventive concept and methods of accomplishing the same may be understood more readily by reference to the following detailed description of embodiments and the accompanying drawings. Hereinafter, embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
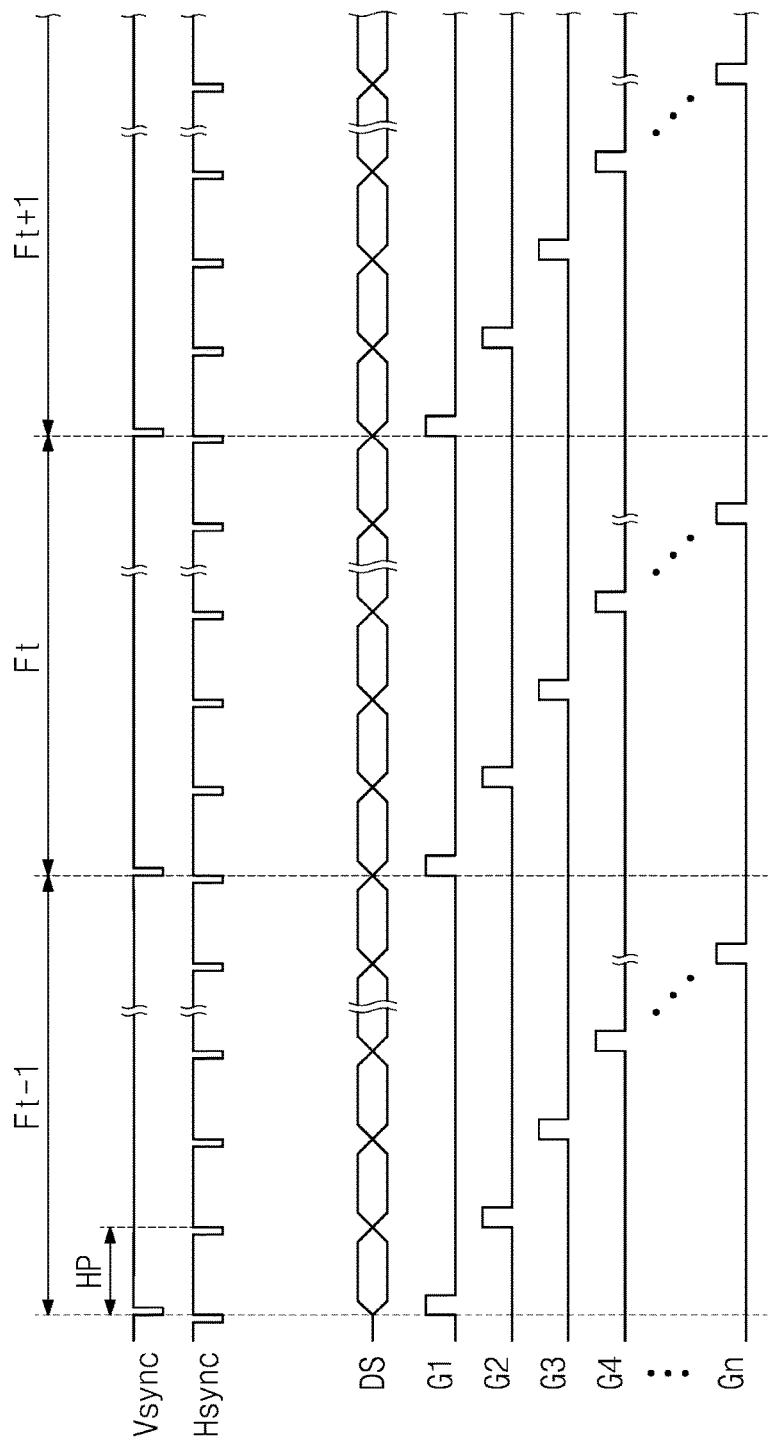
FIG. 2 is a timing chart of signals of a display substrate according to an embodiment of the inventive concept.

FIG. 1 is a plan view of a display substrate according to an embodiment of the inventive concept. FIG. 2 is a timing chart of signals of a display substrate according to an embodiment of the inventive concept.

As illustrated in FIGS. 1 and 2, a display device according to an embodiment of the inventive concept includes a display substrate DP, a gate driving circuit 110, a data driving circuit 120, and a driving controller 130.

The display substrate DP is not particularly limited to, and may include various display panels such as, for example, a liquid crystal display panel, an organic light emitting display panel, an electrophoretic display panel, and an electrowetting display panel. In this embodiment, the display substrate DP is described as the liquid crystal display panel. Meanwhile, a liquid crystal display device including the liquid display panel may further include a polarizer, a backlight unit, and the like.

The display substrate DP includes a first substrate 200, a second substrate 300 spaced from the first substrate 200, and a liquid crystal layer LCL between the first and second substrates 200 and 300. The display substrate DP includes a display area DA in which a plurality of pixels PX11 to PXnm are located, and a non-display area surrounding the display area DA when viewing the display substrate DP as a plane.

The display substrate DP includes a plurality of gate lines GL1 to GLn on the first substrate, and a plurality of data lines DL1 to DLm crossing the plurality of gate lines GL1 to GLn. The plurality of gate lines GL1 to GLn are connected to the gate driving circuit 110. The plurality of data lines DL1 to DLm are connected to the data driving circuit 120. In FIG. 1, only a portion of the plurality of gate lines GL1 to GLn and only a portion of the plurality of data lines DL1 to DLm are illustrated.

In FIG. 1, only a portion of the plurality of pixels PX11 to PXnm are illustrated. The plurality of pixels PX11 to PXnm are respectively connected to corresponding gate lines among the plurality of gate lines GL1 to GLn and corresponding data lines among the plurality of data lines DL1 to DLm.

The plurality of pixels PX11 to PXnm may be respectively categorized into one of a plurality of groups according to display colors. The plurality of pixels PX11 to PXnm may respectively display one of primary colors. The primary colors may include red, green, blue, and white. However, the primary colors are not limited thereto, and in another embodiment, the primary colors may further include various colors such as yellow, cyan, and magenta.

The gate driving circuit 110 and the data driving circuit 120 receive a control signal from the driving controller 130. The driving controller 130 may be mounted on a main circuit board MCB. The driving controller 130 receives image data and a control signal from a graphic controller. The control signal may include a vertical synchronization signal Vsync, which is a signal to identify frame sections Ft−1, Ft, and Ft+1, may include a horizontal synchronization signal Hsync, which is a signal to identify horizontal sections HP (e.g., a column identification signal), may include a data enable signal, which is at a high level only within a data output section to display a data input region, and may include a clock signal.

The gate driving circuit 110 generates gate signals G1 to Gn during the frame sections Ft−1, Ft, and Ft+1 on the basis of a control signal (hereinafter, referred to as a gate control signal), which is received from the driving controller 130, through signal lines GSL. The gate driving circuit 110 outputs gate signals G1 to Gn to the plurality of gate lines GL1 to GLn. The gate signals G1 to Gn may be sequentially output to correspond to the horizontal sections HP. The gate driving circuit 110 may be formed simultaneously with the pixels PX11 to PXnm through a thin film process. For example, the gate driving circuit 110 may be mounted in the non-display area NDA as an oxide semiconductor TFT gate driver circuit (OSG).

In FIG. 1, it is illustrated as an example that one gate driving circuit 110 is connected to left ends of the plurality of gate lines GL1 to GLn. In an embodiment, the display device may include two gate driving circuits. One of the two gate driving circuits may be connected to left ends of the plurality of gate lines Gl1 to GLn, while the other gate driving circuit is connected to right ends of the plurality of gate lines GL1 to GLn. Also, one of the two gate driving circuits may be connected to odd-numbered gate lines, while the other may be connected to even-numbered gate lines.

The data driving circuit 120 generates gray scale voltages according to image data provided from the driving controller 130 on the basis of a control signal (hereinafter, referred to as a data control signal) received from the driving controller 130. The data driving circuit 120 outputs the gray scale voltages to the plurality of data lines DL1 to DLm as data voltages DS.

The data voltages DS may include positive data voltages having a positive value with respect to a common voltage, and/or negative data voltages having a negative value with respect to the common voltage. A portion of data voltages applied to the data lines DL1 to DLm during each of horizontal sections HP may have positive polarity, and another portion may have negative polarity. Polarity of the data voltages DS may be inverted according to the frame sections Ft−1, Ft, and Ft+1 to prevent deterioration of liquid crystal. The data driving circuit 120 may generate data voltages that are inverted by each frame section in response to an inversion signal.

The data driving circuit 120 may include a driver chip 121 and a flexible circuit substrate 122 on which the driver chip 121 is mounted. The data driving circuit 120 may include a plurality of driver chips 121 and flexible circuit substrates 122. The flexible circuit substrate 122 electrically connects the main circuit substrate MCB and the first substrate 200. The plurality of driver chips 121 provide corresponding data signals to corresponding data lines among the plurality of data lines DL1 to DLm.

In FIG. 1, a data driving circuit 120 in a tape carrier package (TCP) type is illustrated as an example. In another embodiment, the data driving circuit 120 may be on the non-display area NDA of the first substrate 200 as a chip on glass (COG) type.

A pixel PXij of the pixels PX11 to PXnm includes a thin film transistor and a liquid crystal capacitor, and may also include a storage capacitor. The pixel PXij is electrically connected to an i-th gate line GLi and a j-th data line DLj. The pixel PXij outputs a pixel voltage corresponding to a data signal received from the j-th data line DLj in response to a gate signal received from the i-th gate line GLi. The liquid crystal capacitor in the pixel PXij charges the pixel voltage received from the data line DLj. The arrangement of a liquid crystal director included in a liquid crystal layer LCL (see FIG. 4) changes according to the amount of charged electrons in the liquid crystal capacitor. Light incident in the liquid crystal layer may be transmitted or blocked according to the arrangement of the liquid crystal director.

The display substrate DP according to an embodiment may include pixels operating in a vertical alignment (VA) mode, a patterned vertical alignment (PVA) mode, an in-plane switching (IPS) mode, a fringe-field switch (FFS) mode, or a plane-to-line switching (PLS) mode.

Figure 3:
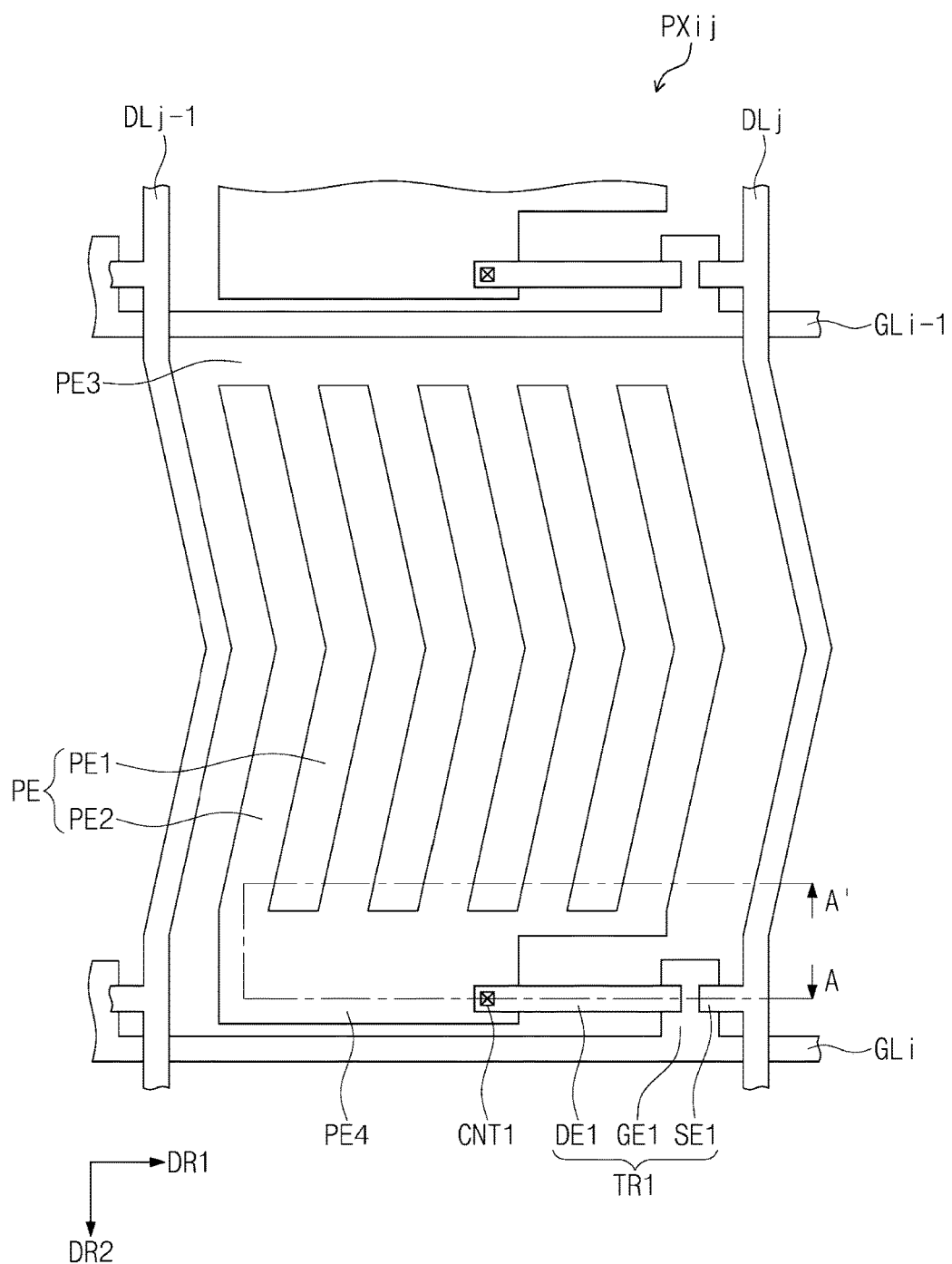
FIG. 3 is a plan view of a pixel area of the display substrate illustrated in FIG. 1.
Figure 4:
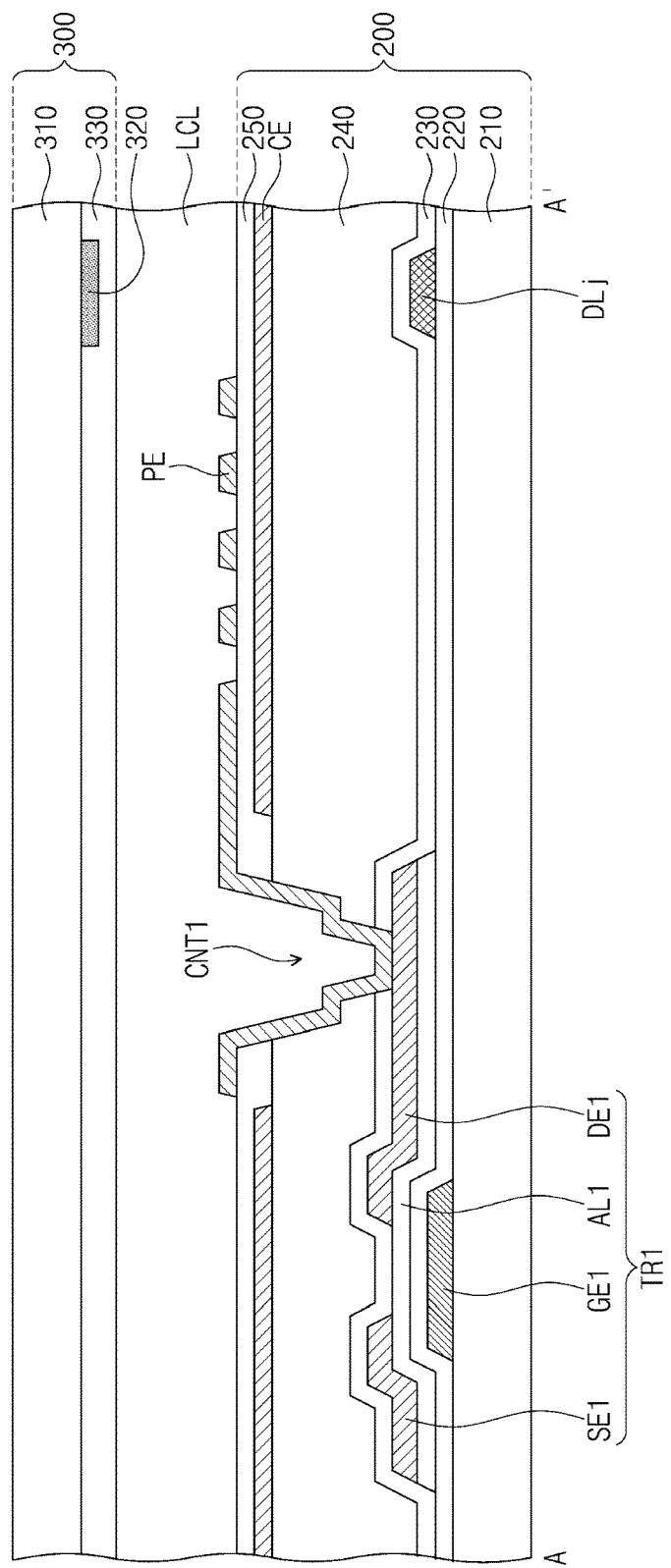
FIG. 4 is a cross-sectional view taken along the line A-A' illustrated in FIG. 3.

FIG. 3 is a plan view of a pixel area of a display substrate illustrated in FIG. 1, and FIG. 4 is a cross-sectional view taken along the line A-A' illustrated in FIG. 3.

In FIG. 3, a pixel PXij connected to an i-th gate line GLi and a j-th data line DLj is illustrated for convenience of explanation. Herein, each of a plurality of pixels PX11 to PXnm have a substantially identical structure as one another and as the illustrated pixel PXij.

Referring to FIGS. 1, 3, and 4, the display substrate DP may include the first substrate 200, the second substrate 300 facing the first substrate 200, and the liquid crystal layer LCD between the first and second substrates 200 and 300.

The first substrate 200 includes the display area DA and the non-display area NDA that are illustrated in FIG. 1. The pixel PXij may be located in the display area DA. The pixel PXij may be connected to the i-th gate line GLi of the gate lines GL1 to GLn, and to the j-th data line DLj of the data lines DL1 to DLm.

The first substrate 200 is a thin film transistor array substrate in which thin film transistors Tr are provided to drive liquid crystal molecules of the liquid crystal layer LCD, and includes a first insulation substrate 210 made of transparent glass, plastic, or the like. The first insulation substrate 210 may be a rigid type substrate, or may also be a flexible type substrate. The rigid type substrate may include a glass substrate, a quartz substrate, a glass ceramic substrate, and/or a crystallized glass substrate. The flexible type substrate may include a film substrate including polymer organic material, or a plastic substrate.

n gate lines GL1 to GLn and m data lines DL1 to DLm may be provided on the first insulation substrate 210. A first metal layer is formed on the first insulation substrate 210, and a first gate electrode GE1 and gate lines GLi-1 and GLi are formed in the display area DA by patterning the first metal layer. The first metal layer may be made of aluminum-based metal such as aluminum (Al) or aluminum alloy, silver-based metal such as silver (Ag) or silver alloy, copper-based metal such as copper (Cu) or copper alloy, molybdenum-based metal such as molybdenum (Mo) or molybdenum alloy, chrome (Cr), tantalum (Ta), and/or titanium (Ti). The first metal layer may have a multi-layer structure including two conductive films having different physical properties from each other.

The gate lines GLi-1 and GLi may be electrically insulated from the data lines DLj-1 and DLj by a gate insulation layer 220. The gate insulation layer 220 may be made of silicon nitride (SiNx) or silicon oxide (SiOx). A first semiconductor layer AU is formed on the gate insulation layer 220, the semiconductor layer AL1 being made of hydrogenated amorphous silicon, polysilicon, or an oxide semiconductor. The first semiconductor layer AL1 is located on the first gate electrode GE1. The first semiconductor layer AL1 may include a semiconductor layer and an ohmic contact layer. In this case, the semiconductor layer is on the gate insulation layer 220, and the ohmic contact layer is on the semiconductor layer.

A second metal layer is formed on the gate insulation layer 220 and the first semiconductor layer AL1, and a first source electrode GE1, a first drain electrode DE1, and data lines DLj-1 and DLj are formed by patterning the second metal layer. The second metal layer may be made of a refractory metal, such as molybdenum, chrome, tantalum, titanium, or an alloy thereof. The first drain electrode DE1 is above the first gate electrode GE1, and is spaced (e.g., spaced by a predetermined distance) from the first source electrode SE1. Thereby, the thin film transistor Tr is completed.

The thin film transistor Tr and the data lines DLj-1 and DLj are covered by a first protection layer 230. The first protection layer 230 may be made of an inorganic insulation material, such as SiNx or SiOx. Also, the first protection layer 230 may be composed of a single layer made of any one of SiNx or SiOx, and in another embodiment, the first protection layer 230 may have a dual-film structure composed of an upper layer and a lower layer each made of SiNx and/or SiOx.

An organic insulation layer 240 made of an acrylic resin is laminated on the first protection layer 230. In another embodiment, a color filter layer may be formed instead of the organic insulation layer 240. In this case, the color filters 330 provided on the second substrate 300 will be omitted.

A first transparent conductive layer is formed on the organic insulation layer 240. The first transparent conductive layer may be made of a transparent conductive material, such as indium tin oxide. A common electrode CE is formed on the organic insulation layer 240 by patterning the first transparent conductive layer. The common electrode CE is covered by a second protection layer 250. The second protection layer 250 may be made of an inorganic insulation material, such as SiNx or SiOx.

A second transparent conductive layer is formed on the second protection layer 250. The second transparent conductive layer may be made of a transparent conductive material, such as indium tin oxide. An electrode pattern is formed on the second protection layer 250 by patterning the second transparent conductive layer. Through a patterning process, a plurality of openings are defined in the electrode pattern to expose the second protection layer 250. A pixel electrode PE may be formed by patterning the electrode pattern.

As illustrated in FIG. 3, each of the data lines DL1 to DLm has a symmetrically bent shape with respect to a center line penetrating a center point of a separation distance between the gate lines GL1 to GLn. A direction in which each of the data lines DL1 to DLm are bent may be switched to the opposite direction by one column unit (e.g., the direction in which the data lines DL1 to DLm are bent may alternate between columns).

Also, the thin film transistor Tr, the pixel electrode PE, and the common electrode CE are further provided on the first insulation substrate 210. More particularly, the thin film transistor Tr includes the first gate electrode GE1 composed of a portion of the gate line GLi, the first source electrode SE1 composed of a portion of the data line Dj, and the first drain electrode DE1 on the first gate electrode GE1 and spaced from the first source electrode SE1. The first drain electrode DE1 is electrically connected to the pixel electrode PE.

In an embodiment, the pixel electrode PE includes a plurality of cut portions PE1, a plurality of branch electrodes PE2 defined by the plurality of cut portions PE1, a first connection electrode PE3 connecting first ends of the plurality of branch electrodes PE2 to each other, and a second connection electrode PE4 connecting second ends of the plurality of branch electrodes PE2. The plurality of branch electrodes PE2 may generally extend in a second direction DR2 in a space between the data lines DLj-1 and DLj and arranged in a first direction DR1. Also, each of the plurality of branch electrodes PE2 has a symmetrically bent shape with respect to the center line.

The common electrode CE is provided on or under the pixel electrode PE, and may be formed to have a size corresponding to a pixel area defined by the data lines DLj-1 and DLj. As illustrated in FIG. 4, the common electrode CE is provided on the organic insulation layer 240, and covered by the second protection layer 250. As aforementioned, the common electrode CE is provided under the pixel electrode PE, and faces the pixel electrode PE with the second protection layer 250 therebetween.

The common electrodes CE at a same pixel column may be integrally formed, or may be electrically connected to each other to form a common electrode column. The common electrode column may be electrically connected to a reference voltage supply line on one side of the first insulation substrate 210 to receive a common voltage from the driving controller 130 (see FIG. 1).

The second substrate 300 includes a second insulation substrate 310, a plurality of color filters 330 on the second insulation substrate 310, and a black matrix 320 at an area between adjacent color filters 330. The black matrix 320 may be provided in an area corresponding to an area in which the data line DLj is formed to block light leakage caused by misalignment of liquid crystal molecules. The second insulation substrate 310 faces and may be coupled to the first insulation substrate 210, while the liquid crystal layer LCL is between the first and second substrates 200 and 300.

A contact hole CNT1 exposing the first drain electrode DE1 is formed in the first protection layer 230, in the organic insulation layer 240, and in the second protection layer 250. The pixel electrode PE is formed on the second protection layer and on the first drain electrode DE1 via the contact hole CNT1. The pixel electrode PE on the second protection layer 250 directly contacts the first drain electrode DE1 exposed through the contact hole CNT1 in an area in which the contact hole CNT1 is defined.

When a gate signal Gi is applied to the pixel PXij through a gate line GLi, the thin film transistor Tr is turned on in response to the gate signal Gi. A data voltage applied to a data line Dj is output to the first drain electrode DE1 of the thin film transistor Tr to be applied to the pixel electrode PE.

An electric field may be formed between the pixel electrode PE receiving a data voltage and the common electrode CE receiving a common voltage Vcom. Liquid crystal molecules in the liquid crystal layer LCL may rotate or align in a given direction between the first and second insulation substrates 210 and 310 due to the electric field. As the liquid crystal molecules rotate or align, the display substrate DP may transmit or block light. Rotation of the liquid crystal molecules may indicate an actual rotation of the liquid crystal molecules, or may indicate reorientation of the liquid crystal molecules that are redirected by the electric field. Polarization of light passing through the liquid crystal layer LCL may change by a direction of the liquid crystal molecules determined thereby.

The pixel electrode PE and the common electrode CE may form a capacitor by having the liquid crystal layer LCL as a dielectric, thereby maintaining an applied voltage even after the thin film transistor Tr is turned off. The pixel PXij may further include a storage line overlapping the pixel electrode PE. The storage line and the pixel electrode PE may form a storage capacitor by having the first and second protection layers 230 and 250 as a dielectric, and may reinforce voltage maintenance capability of a liquid crystal capacitor.

Figure 5:
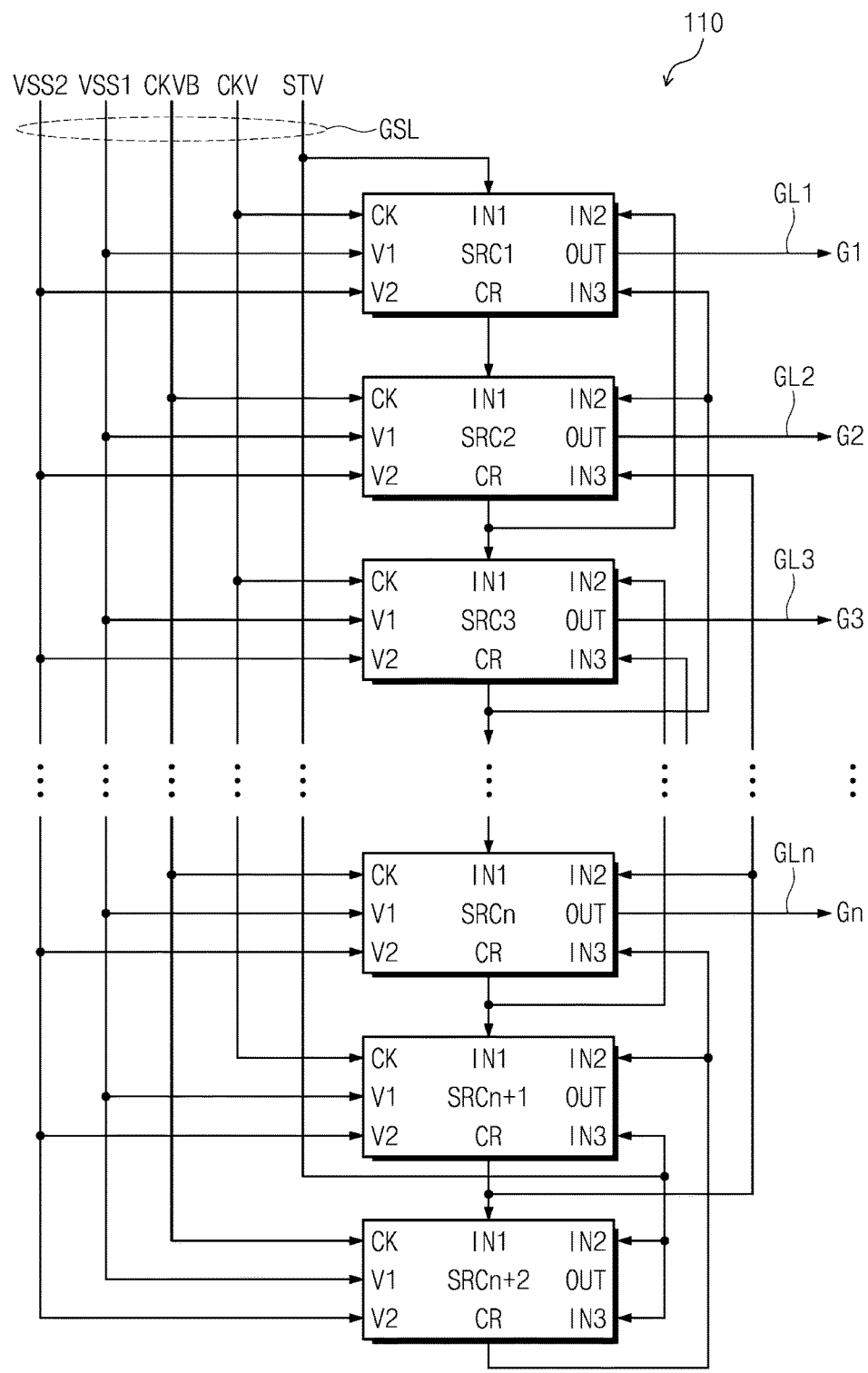
FIG. 5 is a block diagram of a gate driving circuit according to an embodiment of the inventive concept.

FIG. 5 is a block diagram of a gate driving circuit according to an embodiment of the inventive concept.

As illustrated in FIG. 5, a gate driving circuit 110 includes a plurality of driving stages SRC1 to SRCn and dummy driving stages SRCn+1 and SRCn+2. The plurality of driving stages SRC1 to SRCn and the dummy driving stages SRCn+1 and SRCn+2 have a dependent connection relationship such that an operation is performed in response to a carry signal that is output from a previous stage (when applicable) and to a carry signal that is output from a subsequent stage (when applicable).

Each of the plurality of driving stages SRC1 to SRCn receives a first clock signal CKV or a second clock signal CKVB, and also receives a first voltage VSS1 and a second voltage VSS2, from the driving controller 130 illustrated in FIG. 1. The driving stage SRC1 and the dummy driving stages SRCn+1 and SRCn+2 further receive a start signal STV.

In an embodiment, the plurality of driving stages SRC1 to SRCn are connected to the plurality of gate lines GL1 to GLn, respectively. The plurality of the driving stages SRC1 to SRCn provide gate signals G1 to Gn to the plurality of gate lines GL1 to GLn, respectively. In an embodiment, the gate lines connected to the plurality of driving stages SRC1 to SRCn may be odd-numbered gate lines or even-numbered gate lines of the plurality of gate lines.

Each of the plurality of driving stages SRC1 to SRCn and the dummy driving stages SRCn+1 and SRCn+2 includes a first input terminal IN1, a second input terminal IN2, a third input terminal IN3, a gate output terminal OUT, a carry output terminal CR, a clock terminal CK, a first power terminal V1, and a second power terminal V2.

A gate output terminal OUT of each of the plurality of driving stages SRC1 to SRCn is connected to a corresponding gate line of the plurality of gate lines GL1 to GLn. A gate signal generated from the plurality of driving stages SRC1 to SRCn is provided to the plurality of gate lines GL1 to GLn through the gate output terminal OUT.

The carry output terminal CR of each of the plurality of driving stages SRC1 to SRCn is electrically connected to the first input terminal IN1 of a respective subsequent driving stage/dummy driving stage following a corresponding driving stage. Also, the carry output terminal CR of the plurality of driving stages SRC2 to SRCn and the dummy driving stages SRCn+1 SRCn+2 is electrically connected to the second input terminal IN2 of a respective previous driving stage/dummy driving stage. For example, the carry output terminal CR of a k-th driving stage is connected to a second input terminal IN2 of a (k−1)th driving stage and to the first input terminal of a (k+1)th driving stage. The carry output terminal CR of the k-th driving stage is also connected to the third input terminal IN3 of a (k−2)th driving stage SRCk−2. The carry output terminal CR of each of the plurality of driving stages SRC1 to SRCn and the dummy driving stages SRCn+1 and SRCn+2 outputs a carry signal.

The first input terminal IN1 of each of the plurality of driving stages SRC2 to SRCn and the dummy driving stages SRCn+1 and SRCn+2 receives a carry signal of a previous driving stage/dummy driving stage. For example, the first input terminal IN1 of a k-th driving stage SRCk receives a carry signal CRk−1 of a (k−1)th driving stage SRCk−1. The first input terminal IN1 of the first driving stage SRC1 of the plurality of driving stages SRC1 to SRCn, however, receives the vertical start signal STV from the driving controller 130 illustrated in FIG. 1 instead of a carry signal of a previous driving stage.

The second input terminal IN2 of each of the plurality of driving stages SRC1 to SRCn and the dummy driving stage SRCn+1 receives a carry signal from the carry output terminal CR of a subsequent driving stage/dummy driving stage. For example, the second input terminal IN2 of a k-th driving stage SRCk receives a carry signal CRk+1 output from the carry output terminal CR of a (k+1)th driving stage SRCk+1. The second input terminal IN2 of the nth driving stage SRCn receives a carry signal CRn+1 output from the carry output terminal CR of the dummy driving stage SRCn+1.

In another embodiment, the second input terminal IN2 of each of the plurality of driving stages SRC1 to SRCn may also be electrically connected to the gate output terminal OUT of a subsequent driving stage.

The third input terminal IN3 of each of the plurality of driving stages SRC1 to SRCn receives a carry signal from the carry output terminal CR of a driving stage/dummy driving stage that is after a subsequent driving stage/dummy driving stage. For example, the third input terminal IN3 of a k-th driving stage SRCk receives a carry signal CRk+2 output from the carry output terminal CR of a (k+2)th driving stage SRCk+2. The third input terminal IN3 of the nth driving stage SRCn receives a carry signal CRn+2 output from the carry output terminal CR of the second dummy driving stage SRCn+2.

In another embodiment, the third input terminal IN3 of the k-th driving stage SRCk may also be electrically connected to the gate output terminal OUT of the (k+2)th driving stage SRCk+2.

The clock terminal CK of each of the plurality of driving stages SRC1 to SRCn and dummy driving stages SRCn+1 and SRCn+2 receives any one of the first clock signal CKV or the second clock signal CKVB. The clock terminals CK of odd-numbered driving stages SRC1, SRC3, SRCn−1 of the plurality of driving stages SRC1 to SRCn, as well as the clock terminal CK of the first dummy driving stage SRCn+1, may receive the first clock signal CKV, respectively. The clock terminals CK of even-numbered driving stages SRC2, SRC4, SRCn of the plurality of driving stages SRC1 to SRCn, as well as the clock terminal CK of the second dummy driving stage SRCn+2, may receive the second clock signal CKVB, respectively. The first clock signal CKV and the second clock signal CKVB may be signals of different phase.

The first power terminal V1 of each of the plurality of driving stages SRC1 to SRCn and the dummy driving stages SRCn+1 and SRCn+2 receives the first voltage VSS1. The second power terminal V2 of each of the plurality of driving stages SRC1 to SRCn and the dummy driving stages SRCn+1 and SRCn+2 receives the second voltage VSS2. The first and second voltages VSS1 and VSS2 have different voltage levels from each other, and the voltage level of the second voltage VSS2 may be less than the voltage level of the first voltage VSS1.

In an embodiment, each of the plurality of driving stages SRC1 to SRCn and the dummy driving stages SRCn+1 and SRCn+2 may have any one of the first input terminal IN1, the second input terminal IN2, the gate output terminal OUT, the carry output terminal CR, the clock terminal CK, the first power terminal V1, or the second power terminal V2 omitted therefrom, or may further include other terminals. For example, any one of the first power terminal V1 or the second power terminal V2 may be omitted. In this case, each of the plurality of driving stages SRC1 to SRCn receives only one of the first voltage VSS1 or the second voltage VSS2. Also, connection relationship of the plurality of driving stages SRC1 to SRCn may also be changed.

Figure 6:
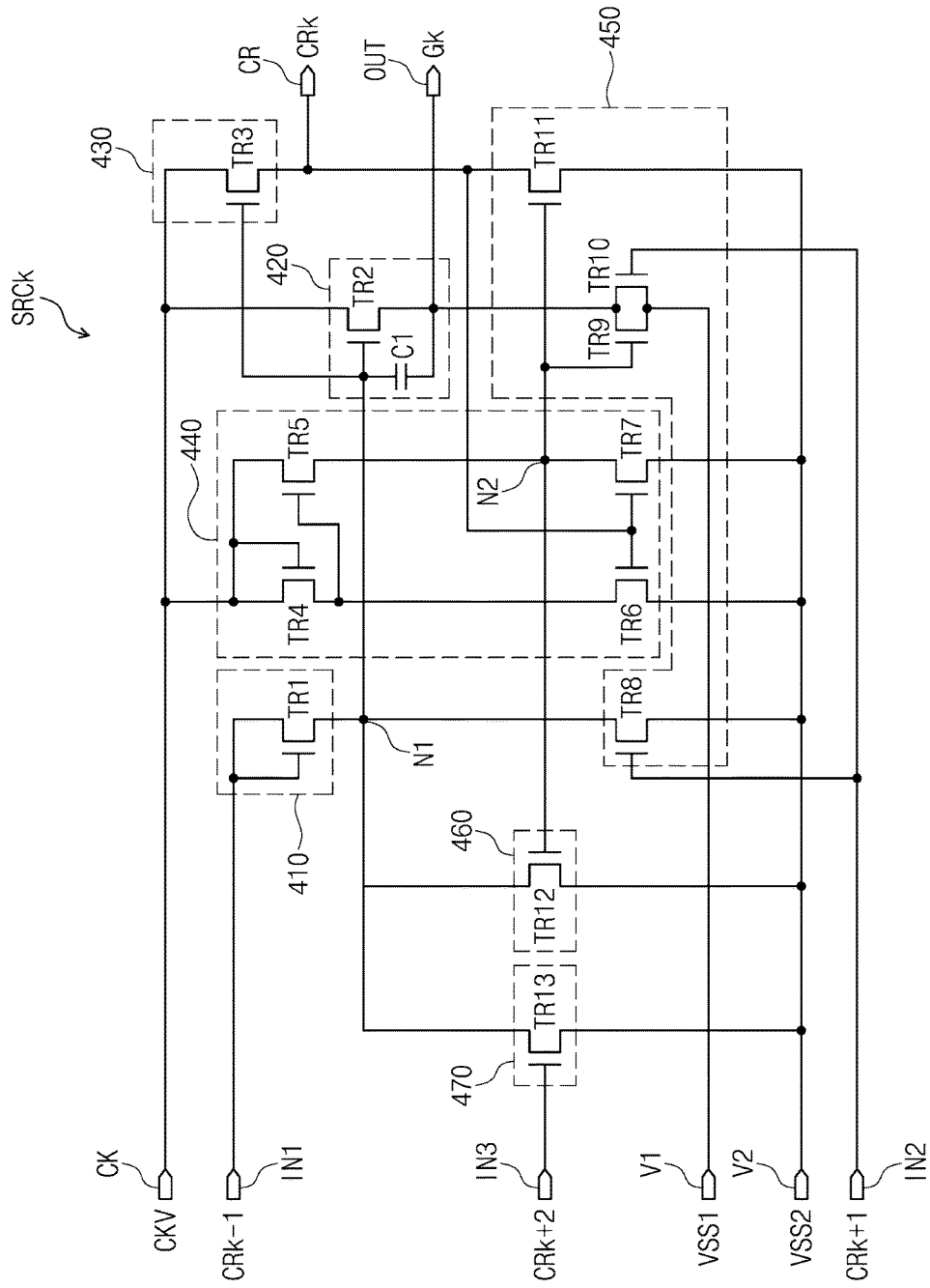
FIG. 6 is a circuit diagram of a driving stage according an embodiment of the inventive concept.

FIG. 6 is a circuit diagram of a driving stage according to an embodiment of the inventive concept.

In FIG. 6, a k-th (k is a positive natural number greater than 1) driving stage SRCk of the plurality of driving stages SRC1 to SRCn illustrated in FIG. 5 is illustrated as an example. Each of the plurality of driving stages SRC1 to SRCn illustrated in FIG. 5 may have an identical structure to the circuit of the k-th driving stage SRCk illustrated in FIG. 6. The driving stage SRCk illustrated in FIG. 6 receives the first clock signal CKV, although the driving stage SRCk may alternatively receive the second clock signal CKVB instead of the first clock signal CKV.

Referring to FIG. 6, the k-th driving stage SRCk includes an input circuit 410, a first output circuit 420, a second output circuit 430, a discharge hold circuit 440, a first pull down circuit 450, a second pull down circuit 460, and a third pull down circuit 470.

The input circuit 410 receives a (k−1)th carry signal CRk−1 from a (k−1)th driving stage SRCk−1, and pre-charges a first node N1. The first output circuit 420 outputs the first clock signal CKV as a k-th gate signal Gk in response to a signal of the first node N1. The second output circuit 430 outputs the first clock signal CKV as a k-th carry signal CRk in response to the signal of the first node N1.

The discharge hold circuit 440 transfers the first clock signal CKV to a second node N2 in response to the first clock signal CKV, and discharges the second node N2 to the second voltage VSS2 in response to the k-th carry signal CRk.

The first pull down circuit 450 discharges the k-th gate signal Gk to the first voltage VSS1 in response to a signal of the second node N2 and also in response to a (k+1)th carry signal CRk+1 from a (k+1)th driving stage SRCk+1, and discharges the first node N1 and the k-th carry signal CRk to the second voltage VSS2.

The second pull down circuit 460 discharges the first node N1 to the second voltage VSS2 in response to the signal of the second node N2.

The third pull down circuit 470 discharges the first node N1 to the second voltage VSS2 in response to a (k+2)th carry signal CRk+2 from a (k+2)th driving stage SRCk+2.

A configuration example of the input circuit 410, the first output circuit 420, the second output circuit 430, the discharge hold circuit 440, the first pull down circuit 450, the second pull down circuit 460, and the third pull down circuit 470 is given as follows.

The input circuit 410 includes an input transistor TR1. The input transistor TR1 includes a first electrode connected to the first input terminal IN1 for receiving a (k−1)th carry signal CRk−1 from a (k−1)th driving stage SRCk−1, a second electrode connected to the first node N1, and a gate electrode also connected to the first input terminal IN1.

The first output circuit 420 includes a first output transistor TR2 and a capacitor C1. The first output transistor TR2 includes a first electrode connected to the clock terminal CK for receiving a first clock signal CKV, a second electrode connected to the gate output terminal OUT for outputting a k-th gate signal Gk, and a gate electrode connected to the first node N1. The capacitor C1 is connected between the first node N1 and the gate output terminal OUT.

The second output circuit 430 includes a second output transistor TR3. The second output transistor TR3 includes a first electrode connected to the clock terminal CK, a second electrode connected to the carry output terminal CR for outputting the k-th carry signal CRk, and a gate electrode connected to the first node N1.

The discharge hold circuit 440 includes first to fourth hold transistors TR4, TR5, TR6, and TR7. The first hold transistor TR4 includes a first electrode connected to the clock terminal CK, a second electrode, and a gate electrode connected to the clock terminal CK. The second hold transistor TR5 includes a first electrode connected to the clock terminal CK, a second electrode connected to the second node N2, and a gate electrode connected to the second electrode of the first hold transistor TR4. The third hold transistor TR6 includes a first electrode connected to the second electrode of the first hold transistor TR4, a second electrode connected to the second power terminal V2 for receiving the second voltage VSS2, and a gate electrode connected to the carry output terminal CK for outputting the k-th carry signal CRk. The fourth hold transistor TR7 includes a first electrode connected to the second node N2, a second electrode connected to the second power terminal V2, and a gate electrode connected to the carry output terminal CR.

The first pull down circuit 450 includes first to fourth pull down transistors TR8, TR9, TR10, and TR11. The first pull down transistor TR8 includes a first electrode connected to the first node N1, a second electrode connected to the second power terminal V2, and a gate electrode connected to the second input terminal IN2. The second pull down transistor TR9 includes a first electrode connected to the gate output terminal OUT, a second electrode connected to the first power terminal V1 for receiving the first voltage VSS1, and a gate electrode connected to the second node N2. The third pull down transistor TR10 includes a first electrode connected to the gate output terminal OUT, a second electrode connected to the first power terminal V1, and a gate electrode connected to the second input terminal IN2 for receiving a (k+1)th carry signal CRk+1 from a (k+1)th driving stage SRCk+1. The fourth pull down transistor TR11 includes a first electrode connected to the carry output terminal CR, a second electrode connected to the second power terminal V2, and a gate electrode connected to the second node N2.

The second pull down circuit 460 includes a fifth pull down transistor TR12. The fifth pull down transistor TR12 includes a first electrode connected to the first node N1, a second electrode connected to the second power terminal V2, and a gate electrode connected to the second node N2.

The third pull down circuit 470 includes a sixth pull down transistor TR13. The sixth pull down transistor TR13 includes a first electrode connected to the first node N1, a second electrode connected to the second power terminal V2, and a gate electrode connected to the third input terminal IN3 for receiving a (k+2)th carry signal CRk+2.

For a stable operation of the first output transistor TR2 in the first output circuit 420, capacity of the capacitor C1 should be large enough. A circuit area occupied by the capacitor C1 should be large enough to allow large capacity of the capacitor C1, and this may increase a bezel width W1 in the non-display area NDA of the display substrate DP illustrated in FIG. 1.

Figure 7:
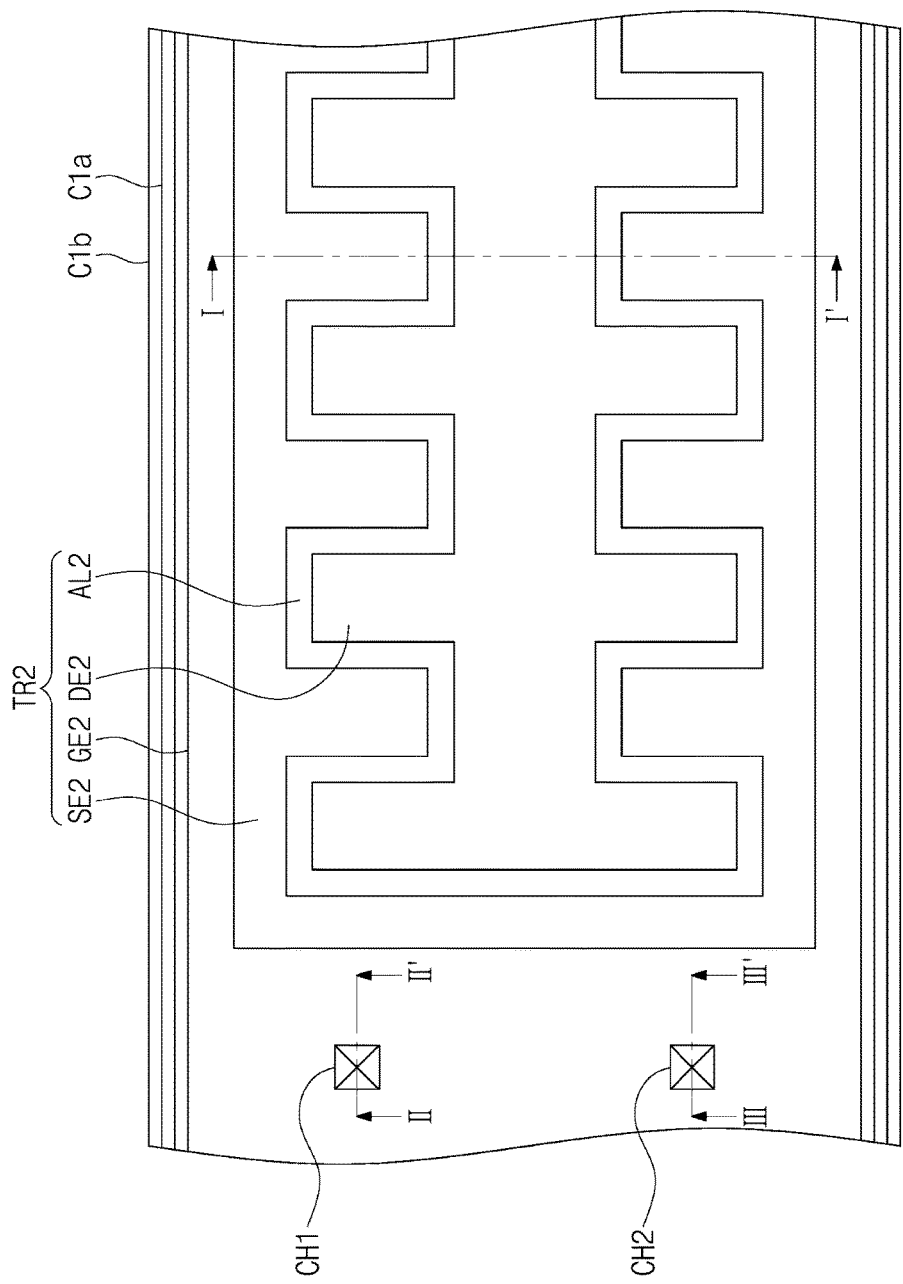
FIG. 7 is a plan view of a first output transistor and a capacitor provided in a non-display area of the display substrate illustrated in FIG. 1.
Figure 8:
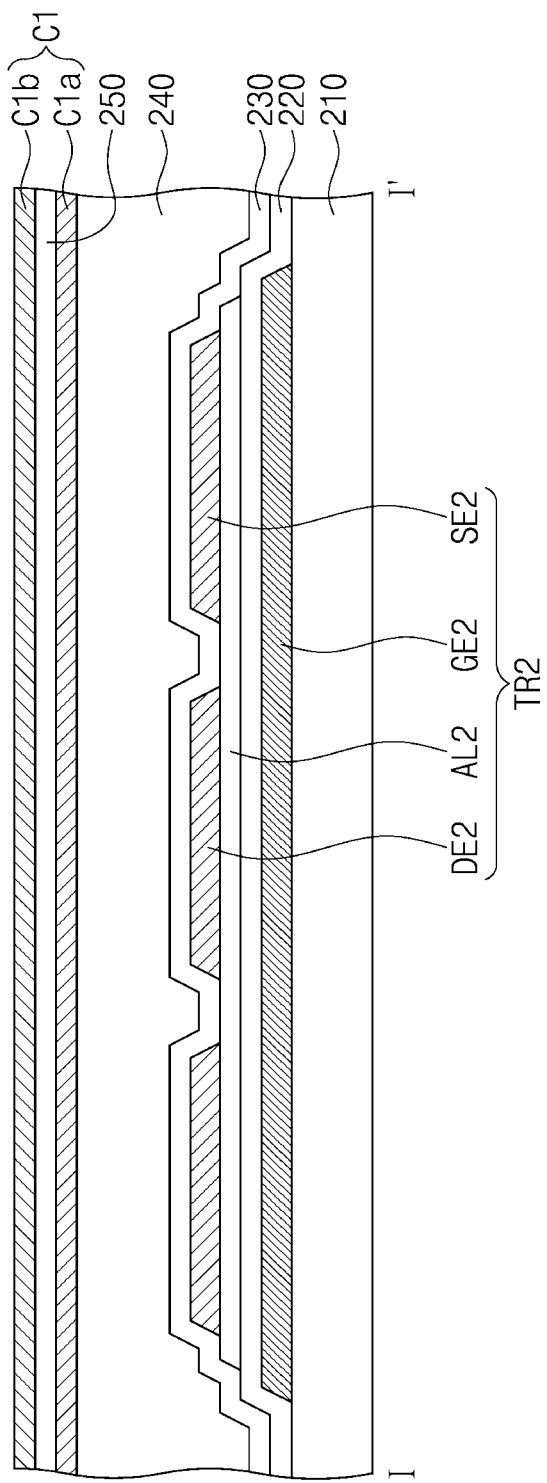
FIG. 8 is a cross-sectional view taken along the line II-II' illustrated in FIG. 7.
Figure 9:
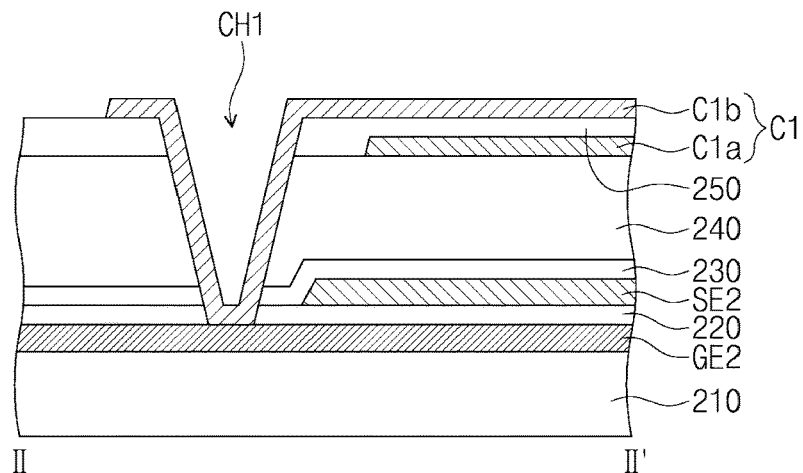
FIG. 9 is a cross-sectional view taken along the line III-III' illustrated in FIG. 7.
Figure 10:
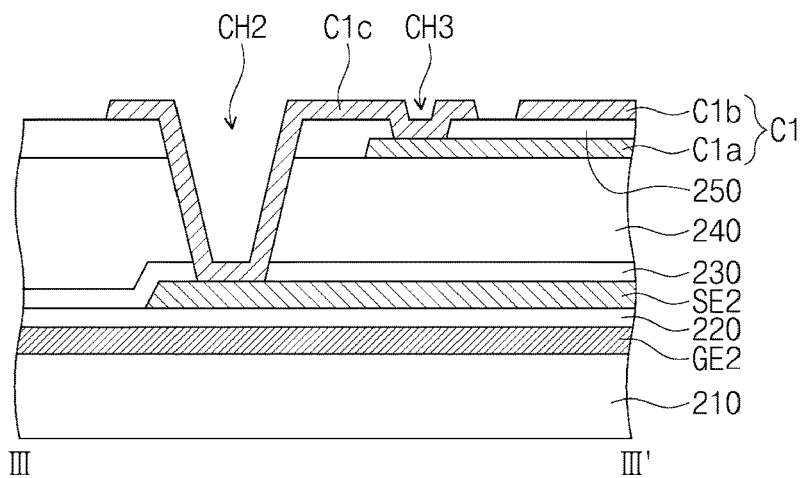
FIG. 10 is a cross-sectional view taken along the line IV-IV' illustrated in FIG. 7.

FIG. 7 is a plan view of a first output transistor and a capacitor provided in a non-display area of a display substrate illustrated in FIG. 1, and FIG. 8 is a cross-sectional view taken along the line II-II' illustrated in FIG. 7. FIG. 9 is a cross-sectional view taken along the line III-III' illustrated in FIG. 7, and FIG. 10 is a cross-sectional view taken along the line IV-IV' illustrated in FIG. 7.

Referring to FIGS. 7 to 10, a first output transistor TR2 includes a second gate electrode GE2, a second semiconductor layer AL2, a second source electrode SE2 and a second drain electrode DE2. A capacitor C1 does not occupy a separate space (in a plan view) from the first output transistor TR2 because the capacitor C1 is formed above the first output transistor TR2. Thus, the bezel width W1 in the non-display area NDA of the display substrate DP illustrated in FIG. 1 may be reduced or minimized.

The second gate electrode GE2 is formed on the first insulation substrate 210 to define a specific area, and the second semiconductor layer AL2 is formed on the second gate electrode GE2 corresponding thereto. The second semiconductor layer AL2 may include an active layer and an ohmic contact layer. Herein, it is preferred that the second semiconductor layer AL2 is formed not to be out of the second gate electrode GE2 area.

The second drain electrode DE2 is formed in a finger shape having multiple branching sections on the second semiconductor layer AL2, and the multiple branching sections are branched in the second gate electrode GE2 area and overlap the second semiconductor layer AL2.

The second source electrode SE2 is formed in a finger shape having multiple branching sections on the second semiconductor layer AL2 and spaced (e.g., spaced by a predetermined distance) from the second drain electrode DE2, and is formed in a shape surrounding the second drain electrode DE2 such that the branching sections of the second drain electrode DE2 and the branching sections of the second source electrode SE2 are alternately arranged. Herein, the shape of the second source electrode SE2 and the second drain electrode DE2, which are formed in the finger shape each having multiple branching sections and alternately arranged so as to be spaced from each other, are subject to change according to characteristics and purpose of the transistor. The second source electrode SE2 and the second drain electrode DE2 are covered by a first protection layer 230. An organic insulation layer 240 made of an acrylic resin is laminated on the first protection layer 230.

The capacitor C1 includes a first capacitor electrode C1a and a second capacitor electrode C1b. The first capacitor electrode C1a is provided on the organic insulation layer 240. A second protection layer 250 is provided so as to cover the first capacitor electrode C1a. The second capacitor electrode C1b is provided on the second protection layer 250. A first contact hole CH1 exposing the second gate electrode GE2 is formed in the second protection layer 250, the organic insulation layer 240, the first protection layer 230, and the gate insulation layer 220. The second capacitor electrode C1b directly contacts the second gate electrode GE2 exposed through the first contact hole CH1.

A second contact hole CH2 exposing the second source electrode SE2 is formed in the second protection layer 250, the organic insulation layer 240, and the first protection layer 230. A third contact hole CH3 exposing the first capacitor electrode C1a is formed in the second protection layer 250. A connection electrode C1c is spaced (e.g., spaced by a predetermined distance) from the second capacitor electrode C1b on the second protection layer 250, and connects the source electrode SE2 exposed through the second contact hole CH2 and the first capacitor electrode C1a exposed through the third contact hole CH3 to each other. The first capacitor electrode C1a may be connected to the second source electrode SE2 through the connection electrode C1c. The first capacitor electrode C1a, the second capacitor electrode C1b, and the connection electrode C1c may be made of the same metal that the second drain electrode DE2 is made of, such as Mo, Al, Cr, Au, Ti, Ni, Nd and Cu.

Referring to FIGS. 4 to 8, each of the first gate electrode GE1, the first semiconductor layer AL1, the first source electrode SE1, and the first drain electrode DE1 of thin film transistor Tr1 may be formed through the same process as the second gate electrode GE2, the second semiconductor layer AL2, the second source electrode SE2, and the second drain electrode DE2 of the first output transistor TR2, on the first insulation substrate 210.

The first capacitor electrode C1a of the capacitor C1 in the non-display area NDA may be formed at the same layer as the common electrode CE in the display area DA and on the organic insulation layer 240. The second capacitor electrode C1b and the connection electrode C1c of the capacitor C1 in the non-display area NDA may be formed through the same process as the pixel electrode PE in the display area DA, on the second protection layer 250. As aforementioned, the capacitor C1 in the driving stage SRC1k (see FIG. 6) may be formed through the same process as the pixel PXij, and therefore no separate mask process is needed to implement the first capacitor electrode C1a and the second capacitor electrode C1b. Particularly, the area separately occupied by the capacitor C1 may be reduced or minimized by forming the first capacitor electrode C1a and the second capacitor electrode C1b to overlap the channel region formed in the second semiconductor layer AL2 of the first output transistor TR2. Therefore, the bezel width W1 of the non-display area NDA of the display substrate illustrated in FIG. 1 may be reduced or minimized.

The first capacitor electrode C1a and the second capacitor electrode C1b may overlap not only the second semiconductor layer AL2 of the first output transistor TR2, but may also overlap all of or a portion of each of the second gate electrode GE2, the second source electrode SE2, and the second drain electrode DE2.

A circuit area of a gate driving circuit having the aforementioned structure is reduced. Therefore, the size of a bezel area of a display substrate having the gate driving circuit may be reduced or minimized.

While embodiments of the present invention has been particularly shown and described with reference to exemplary embodiments thereof, it will be understood by those of ordinary skilled in the art that various changes may be made therein without departing from the scope of the present invention as defined by the following claims. Therefore, technical scope of the present invention should not be construed as limited to those described in the description, but determined by the appended claims and their equivalents.

What is claimed is:

1. A display substrate comprising:
a first substrate having a display area and a non-display area;
a plurality of pixels at the display area; and
a gate driving circuit at the non-display area and comprising:
an output transistor comprising a channel region;
an insulation layer covering the output transistor; and
a capacitor on the insulation layer, electrically connected to the output transistor, and comprising:
a first capacitor electrode on the insulation layer, overlapping the channel region of the output transistor, and electrically connected to a first electrode of the output transistor;
a first protection layer covering the first capacitor electrode; and
a second capacitor electrode on the first protection layer, overlapping the channel region of the output transistor, and electrically connected to a gate electrode of the output transistor.

2. The display substrate of claim 1, wherein the output transistor comprises:
a gate insulation layer on the gate electrode, the gate electrode being on a first insulation substrate;
a semiconductor layer on the gate insulation layer, and with the first electrode thereon;
a second electrode on the semiconductor layer and spaced from the first electrode; and
a second protection layer on the first electrode and the second electrode,
wherein the channel region corresponds to a separation area between the first and second electrodes.

3. The display substrate of claim 2, wherein the insulation layer is on the second protection layer.

4. The display substrate of claim 3, wherein the second capacitor electrode contacts the gate electrode through a first contact hole defined in the first protection layer, the insulation layer, the second protection layer, and the gate insulation layer.

5. The display substrate of claim 3, wherein the capacitor further comprises a connection electrode spaced from the second capacitor electrode on the first protection layer, contacting the first electrode through a second contact hole defined in the first protection layer, the insulation layer, and the second protection layer, and contacting the first capacitor electrode through a third contact hole defined in the first protection layer.

6. The display substrate of claim 2, wherein the second electrode is connected to a clock signal,
wherein the gate electrode is connected to a first node for receiving a previous carry signal, and wherein the first electrode is connected to an output terminal for outputting a k-th gate signal.

7. The display substrate of claim 2, wherein each of the first capacitor electrode and the second capacitor electrode overlaps the second electrode.

8. The display substrate of claim 1, wherein each of the first capacitor electrode and the second capacitor electrode overlaps the gate electrode.

9. The display substrate of claim 1, wherein each of the first capacitor electrode and the second capacitor electrode overlaps the first electrode.

10. The display substrate of claim 1, further comprising:
a second substrate facing the first substrate; and
a liquid crystal layer between the first substrate and the second substrate.

11. The display substrate of claim 1, wherein each of the pixels comprises:
a common electrode on the insulation layer; and
a pixel electrode on the first protection layer, and
wherein the first protection layer covers the common electrode.

12. The display substrate of claim 11, wherein the common electrode and the first capacitor electrode are in a same layer on the insulation layer.

13. The display substrate of claim 11, wherein the pixel electrode and the second capacitor electrode are in a same layer on the first protection layer.

14. The display substrate of claim 1, wherein the insulation layer comprises an organic insulation layer.

* * * * *